United States Patent [19]
McCabe

[11] Patent Number: 4,996,696
[45] Date of Patent: Feb. 26, 1991

[54] WAVEFORM ENCODER

[75] Inventor: David J. McCabe, Winchester, England

[73] Assignee: Shaye Communications Limited, Winchester, England

[21] Appl. No.: 317,665

[22] Filed: Mar. 1, 1989

[30] Foreign Application Priority Data

Mar. 1, 1988 [GB] United Kingdom ............... 8804811

[51] Int. Cl.⁵ ............................................ H04B 14/06
[52] U.S. Cl. .................................... 375/30; 341/143; 341/164
[58] Field of Search .................. 375/26, 27, 28, 30; 332/11 D; 341/108, 143, 155, 164, 166, 167

[56] References Cited

U.S. PATENT DOCUMENTS

| | | | |
|---|---|---|---|
| 3,555,423 | 1/1971 | Weston | 375/30 |
| 3,582,784 | 6/1971 | Gaunt, Jr. | 332/11 D |
| 3,706,944 | 12/1972 | Tewksbury | 375/30 |
| 3,806,806 | 4/1974 | Brolin | 332/11 D |
| 3,995,218 | 11/1976 | Moriya et al. | 375/30 |
| 4,243,974 | 1/1981 | Mack | 341/164 |
| 4,313,206 | 1/1982 | DeFreitas | 375/26 |
| 4,384,278 | 5/1983 | Benjamin | 341/108 |
| 4,411,002 | 10/1983 | Auger | 341/143 |

Primary Examiner—Douglas W. Olms
Assistant Examiner—Stephen Chin
Attorney, Agent, or Firm—Wenderoth, Lind & Ponack

[57] ABSTRACT

A waveform encoder/decoder includes an encoder having an input for an audio signal to be encoded, and an output whereby the digitally encoded signal is passed to a transmission link and thence to a corresponding decoder. The encoder includes detectors for monitoring the digital output signal for slope overload and idle pattern respectively and setting a corresponding value in a state machine. The value stored in the state machine is used to control a pulse width generator which in turn controls the enable time of a tri-state gate connected in the feedback path from the output back to the input. An R.C. filter is used to reconstruct the digital output from the gate to form an estimate of the audio input signal, and this estimated signal is compared with the actual input signal in a comparator. A D-type flip-flop is used to digitize the output from comparator to generate the signal to be output to the transmission link. The circuit, being fully digital, ensures improved repeatability and is particularly convenient and low in cost.

18 Claims, 4 Drawing Sheets

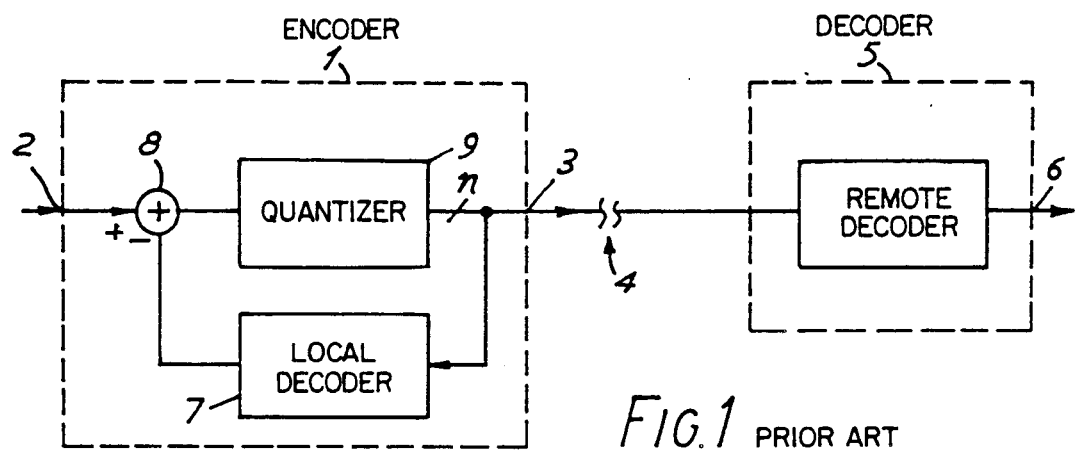
FIG.1 PRIOR ART
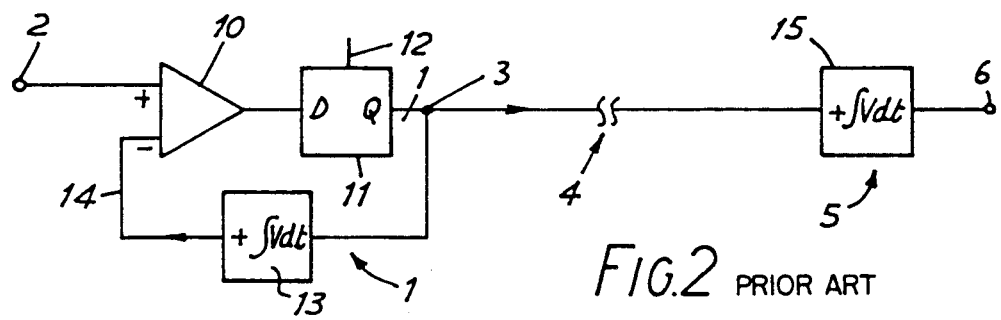
FIG.2 PRIOR ART
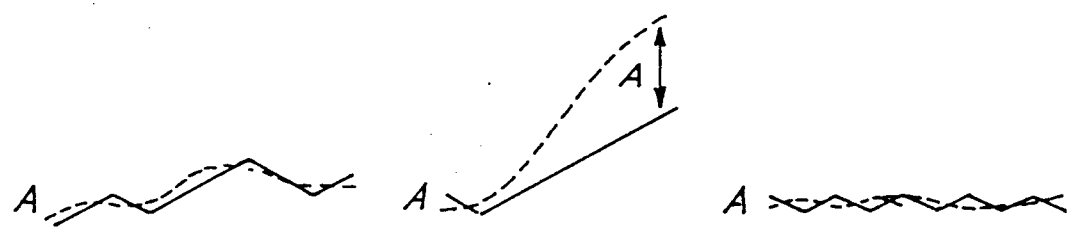
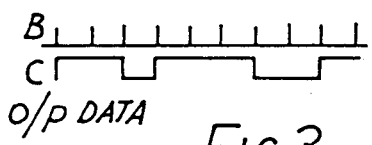
FIG.3   FIG.4   FIG.5
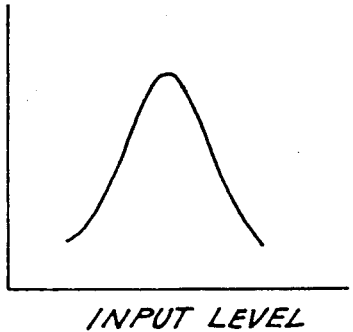
FIG.6

WAVEFORM ENCODER

BACKGROUND OF THE INVENTION

This invention relates to a waveform encoder/decoder, or codec.

One general form of waveform encoder/decoder system is shown in FIG. 1 of the accompanying drawings. The system comprises a local encoder 1 having an input terminal 2 to which is applied a waveform, for example an audio waveform, to be encoded and an output terminal 3 which connects to a transmission path 4 which may be a radio or infra red link or a wire or optic link or similar. The output data at terminal 3 is in the form of a digital data stream. At the remote end, a decoder 5 decodes the digital data stream to reproduce at its output terminal 6 an estimate of the input signal at terminal 2 of the encoder.

The encoder 1 comprises a local decoder 7 which is identical to the remote decoder 5 and acts to reconstruct, from the output digital data stream, an estimate of the input signal at terminal 2. Assuming no transmission errors, the output of the local decoder 7 will be identical to that of the remote decoder 5 since they are both acting on the same data. The estimated input signal reconstructed by local decoder 7 is combined with the real input signal in a subtraction circuit 8 whose output error signal is passed to a quantiser 9. The subtraction circuit and quantiser compares the real input signal and the estimated input signal and outputs a digital word which, when acted upon by the local decoder 7, is such as to reduce the error between the estimated signal and the real signal. As already mentioned, the remote decoder 5, being identical to local decoder 7, and acting on the same digital signal, outputs at terminal 6 an estimated representation of the input signal at terminal 2.

In complex systems of the type illustrated in FIG. 1, both the quantiser and the decoder may be adaptive (variable feedback loop gain), and the data output may take the form of multi-bit words.

FIG. 2 of the accompanying drawings illustrates the so-called delta modulation system, which is probably the simplest implementation of the generalised system shown in FIG. 1. In the FIG. 2 arrangement, the subtraction circuit 8 takes the form of a comparator 10 which outputs a single data bit corresponding to the sign of the error. This is sampled by the quantiser 9 which takes the form of a D-type flip-flop 11. The sampling rate is determined by a system clock signal applied to the flip-flop 11 on line 12. The local decoder 7 takes the form of an integrator 13 which is driven by the digital data stream at output terminal 3. The loop is arranged in such a way that if the real input signal at terminal 2 is greater than the estimate, giving rise to a negative error signal, then a logic 1 bit is output, which latter will cause the integrator 13 to slew in a positive direction, thus reducing the error. In the event that the real input signal is less than the estimate, then the opposite occurs. Thus the estimated signal on line 14 is made to track the input signal at terminal 2. This tracking effect is illustrated in FIG. 3A, where the dotted line represents the input signal—for example a speech waveform—and the solid line shows the estimated signal outputted from the integrator 13. FIG. 3B shows the clock signal on line 12; FIG. 3c shows the digital data stream outputted from flip-flop 11 to the terminal 3.

The remote decoder 5 is realised as an integrator 15 identical to the integrator 13 so that, once again, (and assuming no transmission errors) the output signal at terminal 6 will be identical to that on line 14—i.e. the solid line in FIG. 3A.

There are a number of problems with this simple type of encoder, and two of these will now be described with reference to FIGS. 4 and 5 of the accompanying drawings. The problem illustrated in FIG. 4A is known as delta slope overload and arises when a section of the signal being encoded (shown by the dotted line) changes at too high a rate for the integrator 13 (whose output is shown by the solid line) this leading to an accumulative error illustrated by arrow A in FIG. 4A. The corresponding data stream signal is shown in FIG. 4B. The problem illustrated in FIG. 5A is known as delta idle pattern and arises when the input signal (dotted line) has such a small amplitude—for example a quiescent signal—that it falls below the integrator output steps. In these circumstances, the integrator output changes direction at each clock pulse as it attempts to follow the input signal, giving a triangular wave output signal (solid line) on line 14. The 101010 ... pattern of the output data stream (FIG. 4B) is known as the idle pattern. It will be seen from FIG. 5A that the output signal is grossly in error when compared with the input signal.

It is clear that, with the simple system shown in FIG. 2, there is only a relatively small limited range of input signal amplitudes—above idle pattern and below slope overload—for which good encoding is achieved. FIG. 6 of the accompanying drawings is a plot of signal to noise ratio against input signal amplitude. The left hand slope represents degradation due to idle pattern noise; the right hand slope represents degration due to slope overload. The resultant acceptable dynamic range is too small for effective speech encoding.

FIG. 7 shows a known system designed to improve the dynamic range of the basic delta modulation encoder illustrated in FIG. 2. Note that only the encoder 1 is shown in FIG. 7, it being assumed, as explained above, that a further decoder identical to the local decoder 7 will be provided at the remote end of the transmission path 4.

In the FIG. 7 arrangement, the input to integrator 13 is multiplied by a variable factor so that the integrator exhibits a variable slew rate, and the feedback loop a variable gain. The factor is adjusted in accordance with the amplitude of the input signal: for a large input signal the factor is large and a high slew rate results. This enables the integrator output to be adapted to more closely follow signals which would otherwise have caused slope overload. For small input signals the factor is small and the slew rate reduces which acts to reduce the amplitude of the signal from the integrator in the presence of the idle pattern. Both these effects improve dynamic range.

In order to enable the remote decoder (not shown) to accurately reproduce the input signal, the information for these slew rate changes must come from the output bit stream at terminal 3. To achieve this a shift register 16 is used to count the data bits output from flip-flop 11. The clock system signal on line 12 is applied to the clock input of the register. Three gates 17, 18, 19 are connected at the output of the shift register and are arranged in such a way as to recognise when 4 successive identical bits (all 0's or all 1's) are output from flip-flop 11, this being reckoned to be representative of a slope overload condition—see FIG. 4B. The output from the gates is passed to a CR network comprising capacitor C1 and resistor R1 which produces a voltage which is used to control the slew rate. This is achieved in an analogue multiplier 20 which multiplies the voltage on capacitor C1 with that on the output line from flip-flop 11 to produce an output voltage which sets the slew rate of integrator 13.

In the absence of slope overload, the capacitor C1 discharges to some minimum voltage which thus sets the minimum slew rate of integrator 13. The circuitry is often modified by means, not shown, to give a fast increase and a slow decrease in gain, in order to match the characteristics of speech.

The main problem with the circuitry shown in FIG. 7 is that the analogue multiplier is difficult to implement and is subject to such variables as component tolerances as it is an analogue circuit. As a result, it is very difficult to implement an identical decoder at the remote end, and the system is thus subject to errors.

SUMMARY OF THE INVENTION

The present invention seeks to alleviate this problem by implementing a variable slope delta modulation system entirely in digital components. In order to achieve this in the waveform encoder of the invention, the required gain variation in the feedback loop is obtained by pulse width modulation of the feedback signal.

In an embodiment of the invention the encoder comprises a comparator for comparing an analogue input signal to be decoded with an estimated signal representative of an estimate of the input signal, means for digitising the output of said comparator to provide a digital output signal representative of the analogue input signal and variable gain feedback means connected to the output of said digitising means for generating from the digital output signal said estimate signal, said feedback means comprising gate means operable to selectively gate said digital output signal, filter means for receiving the gated output of said gate means and converting same into an analogue signal representative of an estimate of said input signal, pulse width generator means connected to the output of said digitising means and operable to generate pulses whose width is dictated by certain predetermined characteristics of said digital output signal, and means for applying said variable width pulses to a control terminal of said gate means in order to control the enable time of said gate means and thus vary the gain of the feedback means.

Preferably said pulse width generating means includes detector means for detecting the desired characteristics of the digital output signal, a state machine or counter which holds a value, in digital form, which may be appropriately varied up or down according to information received from said detector means, and a pulse width generator which generates a control pulse signal to be passed to said gate means, the pulse width of said pulse signal being dependent upon the variable value held in the state machine.

Preferably said detector means includes a slope overload detector for detecting when the estimated signal deviates from said actual signal, as evidenced in said digital output signal by the occurrence of a predetermined number of successive identical bits, for example four. Preferably also, said detector means includes an idle pattern detector for detecting a low amplitude level in said analogue input signal, and reducing the loop gain to compensate. Gain reduction may be arranged to occur in the following circumstances:

(a) if a chosen number of bit periods have elapsed since either the last occurrence of the slope overload indication which causes gain increase, or the last decrease (whichever was the most recent). This mimics digitally the action of R1 and C1 in the known system shown in FIG. 7; or (b) if a chosen number of bit periods have elapsed since either the last occurrence of a run of consecutive 1's or 0's which is shorter than that required to cause a gain increase, or the last decrease (whichever was the most recent). The advantage of using a shorter sequence is that gain may be maintained at higher frequencies than with a long sequence. If the length of this sequence is chosen to be 2, then it is equivalent to detecting a chosen number of bits of idle pattern (alternating bits).

As an example, a system may increase gain whenever the last 4 bits are identical, and may decrease gain when no run of 2 identical bits or previous decrease event has occurred for 6 bits.

To maintain a constant signal to noise ratio with varying input levels, it is desirable for the ratio of the gain values before and after each increase to be constant over the whole range of possible gain values. This can be achieved by adding a constant fraction of the present gain at each event, for example:

$$\text{gain:} = \text{gain} + (\text{gain}/8)$$

The same applies to gain decrease events, where a constant fraction would be subtracted. The fractions for increase and decrease need not be the same.

On the other hand, to give improved stability in the presence of transmission errors, it may be desirable to add a small constant value at both increase and/or decrease events, as well as the addition or subtraction of the constant fraction mentioned above. This ensures that to maintain a high gain requires more frequent gain increase events than for a low gain state.

For example, at each gain increase the gain may be recalculated by the formula $$\text{gain:} = \text{gain} + (\text{gain}/8) + 1$$

and at each increase by $$\text{gain:} = \text{gain} - (\text{gain}/16) + 1$$

In a preferred embodiment of the invention the gate means takes the form of a tri-state gate whose enable mode is pulse width modulated by the pulse width generator means.

Also in the preferred embodiment the filter means is implemented as a CR low pass filter network instead of the integrator circuit used in the prior art; however, a conventional integrator could be used in the present apparatus.

A problem which manifests itself particularly when a CR network is used is that the DC operating point of the comparator may be upset by the switching of the gate means. This results in the DC operating point varying as the level of the input signal and gives rise to audible "thumps" in sympathy with the audio signal. In order to overcome this difficulty, an embodiment of the invention provides two parallel feedback loops from the output of the digitising means to the input of the comparator: the first is an AC coupled loop designed to pass the audio frequencies being encoded and having gain adaption facilities operable to generate the aforsaid estimated input signal for application to the comparator; the second is a low pass loop designed to have an insignificant effect at audio frequencies and having no gain adaption facilities, being simply operable to correctly set up the bias levels.

BRIEF DESCRIPTION OF THE DRAWINGS

In order that the invention may be better understood, an embodiment thereof will now be described by way of example only and with reference to the accompanying drawings in which:

FIG. 1 is a block diagram of a generalised waveform encoder/decoder system;

FIG. 2 is a block diagram of one known implementation of the encoder/decoder system of FIG. 1;

FIGS. 3A, B, C are waveform diagrams of the system of FIG. 2;

FIGS. 4 and 5 are waveform diagrams illustrating problems which can arise in the system of FIG. 2;

FIG. 6 is a graph of signal to noise ratio (dB) against input signal amplitude for the system of FIG. 2;

DESCRIPTION OF THE PREFERRED EMBODIMENTS

Figure 8:
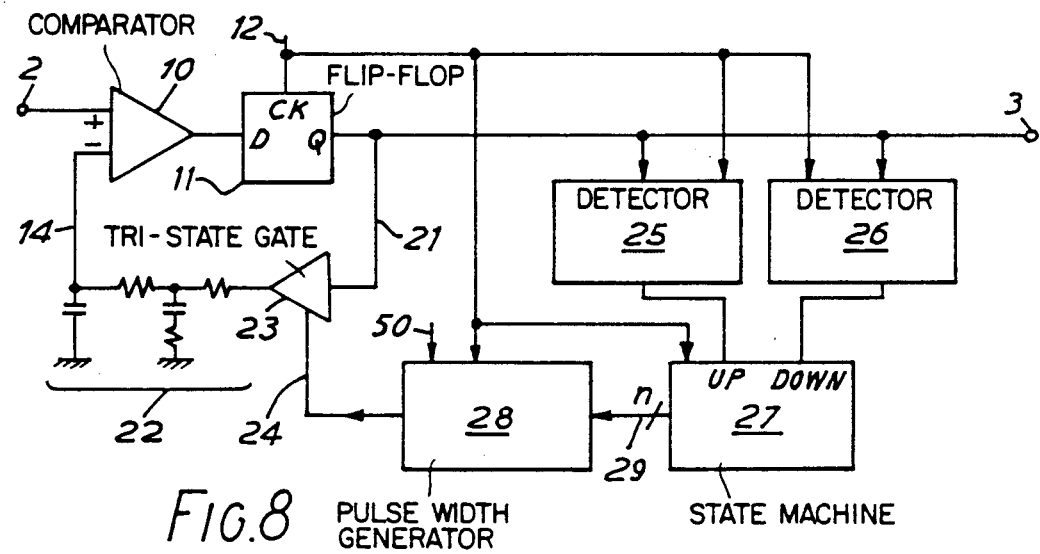
FIG. 8 is a block diagram of an encoder constructed in accordance with the invention.

Referring to FIG. 8, the gain variation is obtained by pulse width modulation of the encoder feedback signal on line 21. The integrator 13 is replaced by a two pole CR network 22 which acts as a low pass filter operable to reconstruct the estimate of the input signal for application to the input of comparator 10 via line 14. The data stream feedback signal on line 21 is passed to the input of the CR network 22 via a tri-state gate 23. The gate 23 is operable to pass a sample of the feedback signal on line 21 to the CR network 22, the length of the sample being dictated by the width of the pulse on the gate control input on line 24. This in turn is dictated by the characteristics of the input signal as seen at the output of flip-flop 11. The gate enable is narrow at low gain and wide at high gain. This controls the amount of current dumped into the CR network 22, and hence the step size.

Figure 7:
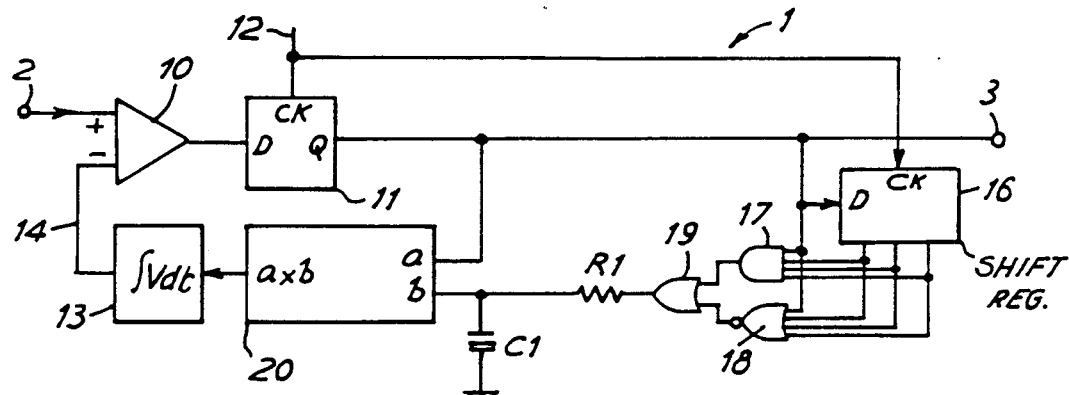
FIG. 7 is a block diagram of a known encoder designed to overcome the problems associated with the system of FIG. 2.

As with the FIG. 7 arrangement, the gain is caused to increment upon the detection of four identical output bits from flip-flop 11. Gain is caused to decrement when a given length of idle pattern is detected at the output of flip-flop 11. To achieve this the encoder of FIG. 8 is equipped with a slope overload detector 25 and an idle pattern detector 26. Both are clocked from the system clock line 12, and have respective inputs connected to the output of flip-flop 11. The gain factor to be used to control the enable time of gate 23 is held in a digital state machine 27 which in turn controls a pulse width generator 28, both clocked from system clock line 12. The pulse width generator also receives a pulse width clock signal on line 50. The state machine applies on its output line 29 a digital gain value which is converted in generator 28 to a pulse width which is applied to line 24 to control the gate 23. The value of the signal on line 29 is controlled by the inputs from the detectors 25, 26, as will be explained in more detail hereinafter.

Figure 9:
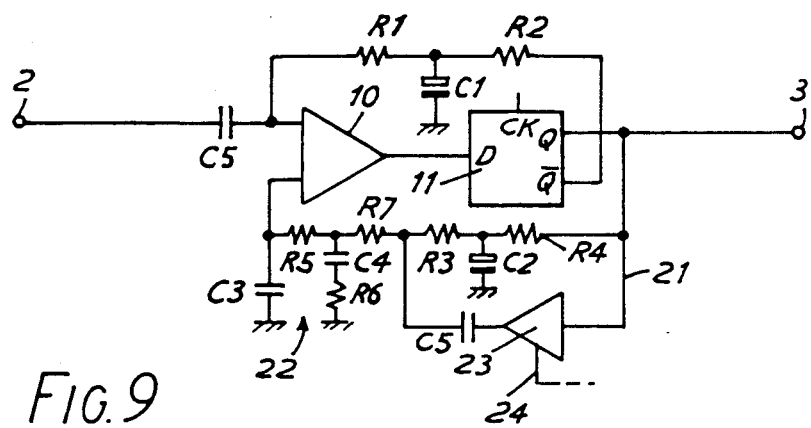
FIG. 9 is a circuit diagram of part of the encoder of FIG. 8.

A practical difficulty of the encoder shown in FIG. 8 is that the effective impedance of the gate 23 is inversely proportional to the pulse width generated. If comparator 10 takes a significant bias current, then the DC operating point will vary as the input level, and hence gain, vary. This results in audible "thumps" in sympathy with the speech signal. To overcome this, the arrangement shown in FIG. 9 may be adopted. In this arrangement, two parallel loops are used: an AC coupled loop similar to that described above to encode the audio waveform, and a low pass loop with no gain adaption to set up the correct bias levels. The low pass loop is formed through the feedback paths R1, C1, and R3, C2, R4 which are sized to provide large time constants sufficient to produce an insignificant response in the audio band. The output of the gate 23 is isolated by capacitor C5 and so does not interfere with the biassing. Resistors R5, R6 and capacitors C3, C4 form the reconstruction filter network 22. An isolating capacitor C5 is connected at the input terminal 2.

Figure 10:
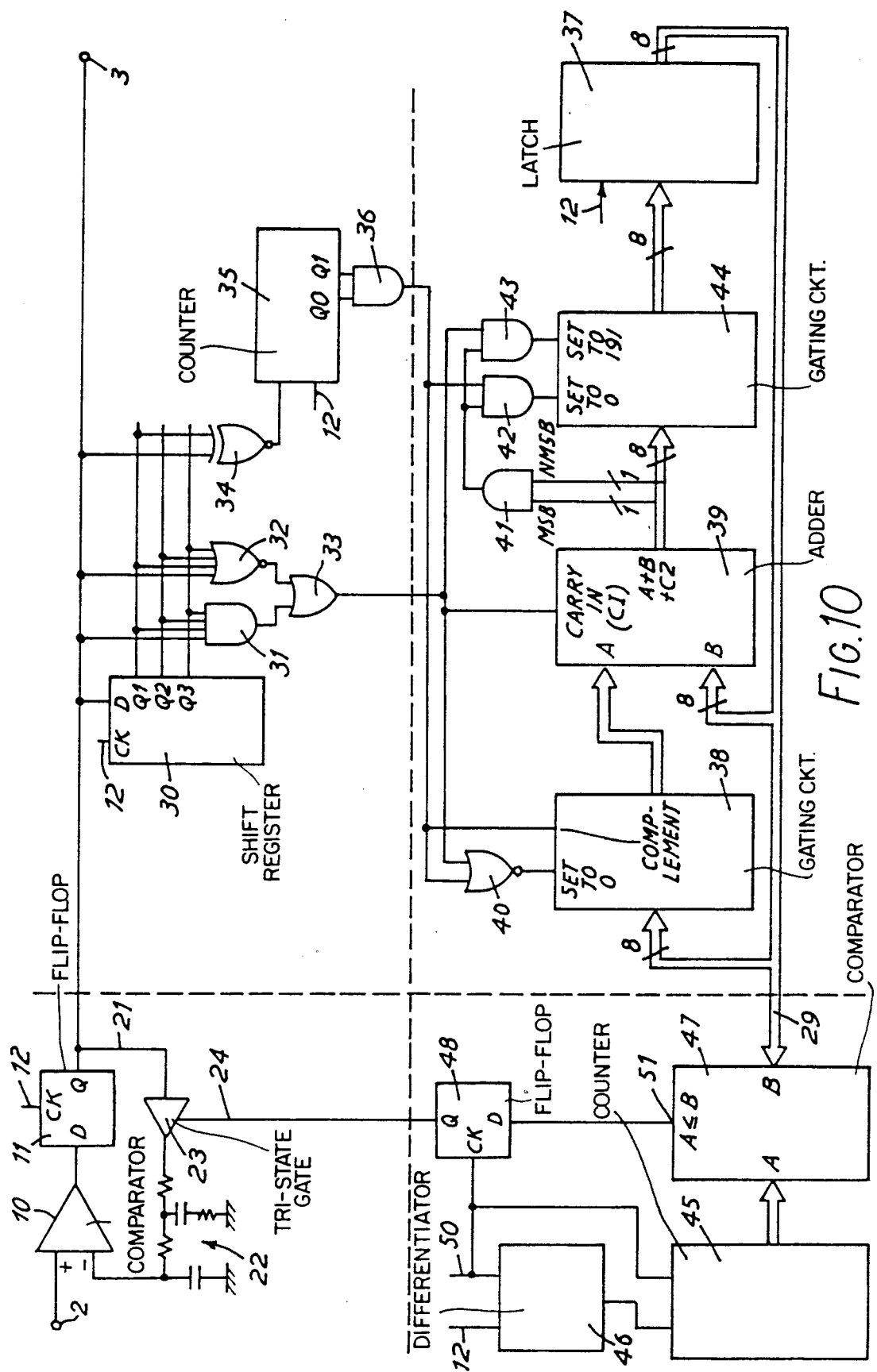
FIG. 10 is a circuit diagram showing the encoder of FIG. 8 in greater detail.

Referring now to FIG. 10, the operation of the encoder of FIG. 8 will now be explained in more detail. The design parameters for the circuit of FIG. 10 are given below, it being understood that these are exemplary only:

| Output data rate | 32 KBit/sec |
|---|---|
| Gain adaption range | 192:1 |
| Gain increase algorithm | 4 consecutive identical bits gain := gain * 1.25 + 1 maximum gain 191 (pulse width) = 192) |
| Gain decrease algorithm | 4 bits idle pattern, non consecutive gain := gain * 0.75 − 1 |

The circuitry in the top right of the diagram contains the slope overload and idle pattern detectors 25, 26. The digital data stream from flip-flop 11 is passed to the input of a three bit shift register 30. Together with the register input, this makes the previous four bits available. Gates 31, 32 and 33 receive the outputs from register 30 and decode cases where all four bits are identical—i.e. all 0's or all 1's. Gate 33 provides a slope overload output signal which is high when four identical bits are detected, as described above. The idle pattern is detected by gate 34, connected to the output of register 30, and a two-bit counter 35 is connected to the output of the gate 34. When the two previous bits are the same, the gate 34 outputs a logic 1 which holds counter 35 in the reset state with its count set to zero. When the two previous bits differ, the counter 35 may count up at the next positive transition of the system clock on line 12. If four alternating bits are output from flip-flop 11 then the counter 35 will reach its terminal count of three and the gate 36, connected to the ouputs of counter 35, will go high, and remain high for one clock period, indicating idle pattern. If the bits continue to alternate, then the counter 35 will repeatedly count through zero back up to three to continually indicate the idle pattern. During counting, the output of gate 36 reverts to logic 0.

Note the difference between the two indications; eight consecutive identical bits will cause slope overload to be indicated for the last five bits, whereas eight alternating bits will cause only two idle indications (during the fourth and eighth bits). This makes an increase in gain occur more quickly than a decrease, as desired. The slope overload and idle pattern signals control the gain value held in the state machine 27 shown at the bottom right of the diagram.

The gain to be outputted by the state machine 27 is represented by an eight bit number held in a latch 37. The latch is clocked from the system clock line 12 so that the output gain value on data bus 29 is refreshed at each clock bit. Usually the value does not change between bits; however slope overload causes a higher value to be outputted, idle pattern a lower value. The gain value is constrained to lie in the range 0 to b 191, giving pulse widths to control the tri-state gate 23 in the range 1 to 192 pulse width clock periods.

Manipulation of the gain value is performed by gating circuitry 38 and an adder 39. The outputs from the detectors 25 and 26 are passed to respective inputs of a gate 40. If neither the slope overload nor the idle pattern outputs is active, then the output of gate 40 is high, and gating circuitry 38 provides a zero output to adder 39. This causes adder 39 to add zero to the current gain value, thus leaving it unaltered. If slope overload is active, then the output of gate 36 is low and the output of gate 40 is likewise low. In these circumstances, both the set and complement inputs to gating circuitry 38 are low, and the output passed to adder 39 represents the gain value, but with the bits shifted right from their usual positions so as to represent the gain value divided by four. The output from gate 33 is passed to the carry input of adder 39. Thus when slope overload is detected, the carry input goes high so that its output becomes (gain+gain/4+1) or (gain*1.25+1), as required.

If idle pattern is detected, the output from gate 36 goes high which causes gating circuitry 38 to perform the shift operation as above, to complement the bits, and to set the two most significant bits to one. This is then added to the gain value and effectively subtracts (gain/4+1) from (gain), thus giving (0.75*gain−1) as the output.

The extra +1 and −1 prevent the state machine from 'sticking' when the gain value is less than four. In this case gain/4 equals zero, and so no increment or decrement would otherwise occur. This could alternatively be prevented by having more bits in the state machine, only the most significant ones contributing to the pulse width but all being used in the arithmetic operations.

A gate 41 is connected to the output of adder 39 and detects an out of range result. The output of gate 41 is passed as an input to two further gates 42, 43. The other input of gates 42, 43 are connected to the outputs of gates 36, 33 respectively. The outputs of gates 42, 43 are passed to respective set inputs of further gating circuitry 44 whose main input is received via an 8-bit data bus from the output of adder 39.

The circuitry 44, and gates 41-43 are operable to limit the result of the addition in adder 39 to the valid range of 0 to 191. Gate 42 detects if the out of range result detected by gate 41 was caused by a gain decrease (corresponding to idle pattern) and sets its output to logic 0. Similarly gate 43 detects if the out of range result is due to a gain increase ncorresponding to slope overload) and forces the output of the gating circuitry 44 to be 192. The output of gating circuitry 14 is gated into the latch 37 via an 8-bit data bus at each positive transition of the clock.

The pulse width variation is implemented by the block shown at the lower left. An eight bit counter 45 counts from 0 to 224 during each system clock period (255 states, 7.2 MHz pulse width clock/32 KHz system clock=225). The counter is synchronised to the bit clock by a clocked differentiator 46, which outputs a single pulse of one pulse width clock period after each positive transition of the system clock. This resets the counter 45 to zero.

The count is compared numerically to the gain value in a comparator 47. The output 51 (A less than or equal to B) goes high for a period equal to (gain+1) pulse width clock periods in each bit. This pulse is retimed by a flip-flop 48 to remove undesirable spikes arising from the operation of the comparator. The output of flip-flop 48 then controls the enabling of the tri-state gate 23, implementing the gain adaption. Rotation of the order of the bits at one input of the comparator may be used to alter the spectral characteristics of the enable signal, reducing the audio filtering requirements.

Figure 11:
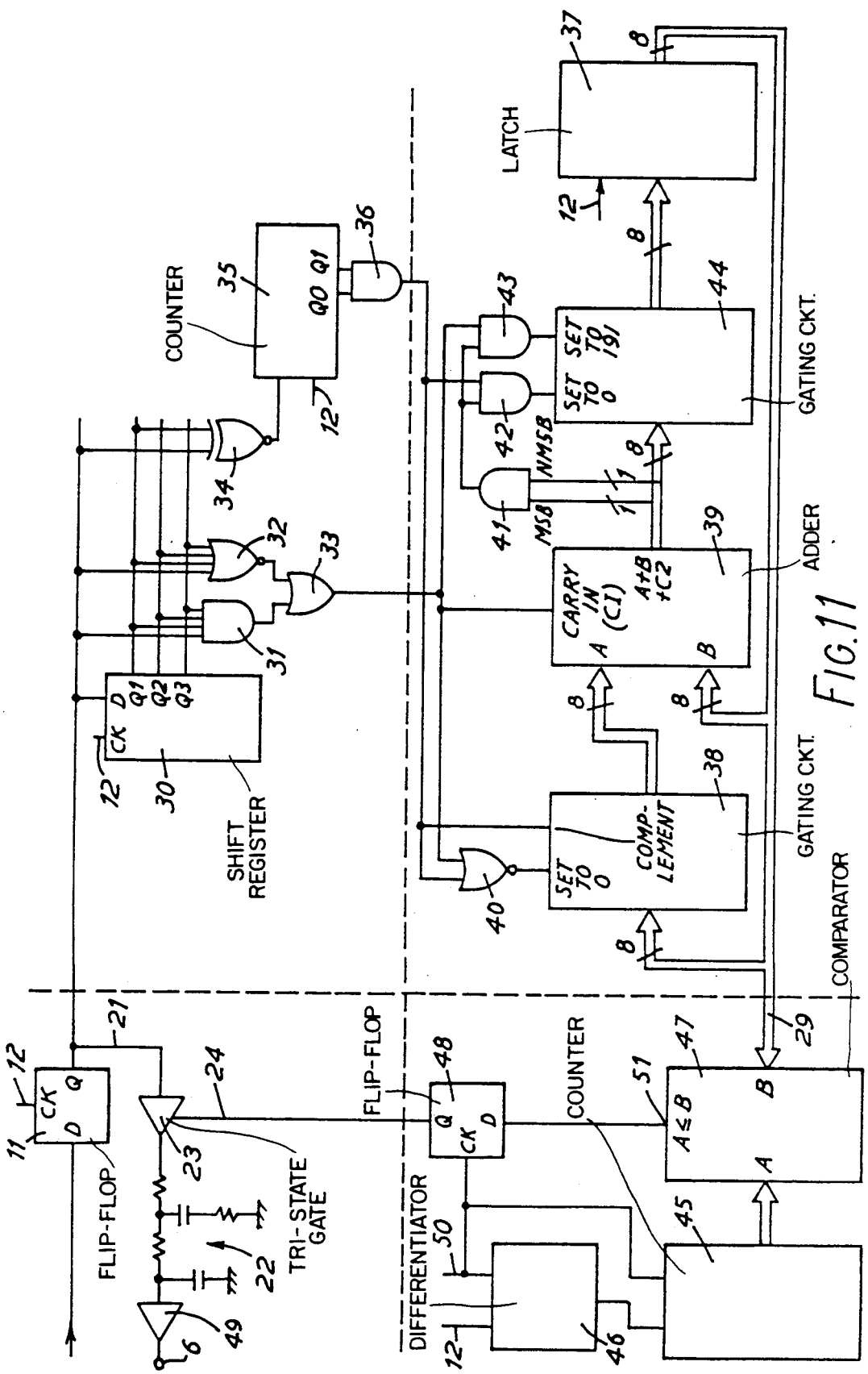
FIG. 11 is a circuit diagram corresponding to FIG. 10, but showing the remote decoder.

FIG. 11 shows a similar diagram for the corresponding decoder. This is virtually identical to the encoder of FIG. 10, with the following exceptions. The comparator 10 is not required; flip-flop 11 accepts the input data to be decoded from the transmission path 4. The output of the reconstruction filter 22 is buffered by an amplifier 49 whose output at terminal 6 is the analogue speech signal. Filtering may be used both before the audio input, and after the audio output.

The principal features of the apparatus described above are as follows:

(1) Use of a tri-state gate and pulse width modulation of its enable mode to implement gain adaption. The gain control is thus digital, with both increase and decrease in gain being caused by partiuclar sequences in the encoder bit stream output. The digital implementation of the encoder gives improved repeatability over analogue gain control methods, and is particularly convenient and low in cost to implement;

(2) Use of a state machine or counter to hold the gain value, possibly with multiplicative gain changes;

(3) Detection of the true idle pattern to reduce gain; and (4) Use of a parallel, non adapting loop to obtain constant bias conditions at the input comparator.

I claim:

1. A waveform encoder apparatus in which the encoder comprises a comparator for comparing an analogue input signal to be decoded with an estimate signal representative of an estimate of the input signal, means for digitising the output of said comparator to provide a digital output signal representative of the analogue input signal and variable gain feedback means connected to the output of said digitising means for generating from the digital output signal said estimate signal, said feedback means including digital gain control means for adjusting the gain of said feedback means in dependence upon certain predetermined characteristics of said digital output signal; wherein two of said feedback means are provided from the output of the digitising means to the input of the comparator means: a first feedback means comprising an AC coupled circuit operable to pass the frequencies of the signal being encoded; and a second feedback means comprising a low pass filter circuit operable to pass the necessary dc bias levels, but passing signals without any significant effect thereon in the range of the frequencies of the signal being encoded.

2. Apparatus as claimed in claim 1 wherein said digital gain control means comprises a pulse width modulator connected to receive the output of the digitising means.

3. Apparatus as claimed in claim 2 wherein said pulse width modulator comprises gate means operable to selectively gate said digital output signal, and pulse width generator means connected to the output of said digitising means and operable to generate pulses whose width is dictated by said predetermined characteristics of said digital output signal, and means for applying said variable width pulses to a control terminal of said gate means in order to control the enable time of said gate means and thus vary the gain of the feedback means.

4. Apparatus as claimed in claim 3 wherein said pulse width generating means includes detector means for detecting the desired characteristics of the digital output signal, a state machine or counter which holds a value, in digital form, which may be appropriately varied up or down according to information received from said detector means, and a pulse width generator which generates a control pulse signal to be passed to said gate means, the pulse width of said pulse signal being dependent upon the variable value held in the state machine.

5. Apparatus as claimed in claim 4 wherein said detector means includes a slope overload detector for detecting when the estimated signal deviates from said actual signal, as evidenced in said digital output signal by the occurrence of a predetermined number of successive identical bits.

6. Apparatus as claimed in either one of claims 4 or 5 wherein said detector means includes an idle pattern detector for detecting a low amplitude level in said analogue input signal, and reducing the loop gain to compensate.

7. Apparatus as claimed in any one of claims 3 to 5 wherein said gate means takes the form of a tri-state gate whose enable mode is pulse width modulated by the pulse width generator means.

8. Apparatus as claimed in any one of claims 1 to 5 wherein said feedback means further includes filter means for receiving the gated output of said gate means and converting same into an analogue signal representative of an estimate of said input signal.

9. Apparatus as claimed in claim 8 wherein said filter means takes the form of a capacitor-resistor network.

10. Apparatus as claimed in any one of claims 1 to 5 wherein said first feedback means includes said digital gain control means, and said second feedback means is isolated from said gain control means.

11. A waveform encoder apparatus comprising a comparator for comparing an analogue input signal to be decoded with an estimate signal representative of an estimate of the input signal, means for digitising the output of said comparator to provide a digital output signal representative of the analogue input signal, variable gain feedback means connected to the output of said digitising means for generating from the digital output signal said estimate signal, said feedback means including digital gain control means for adjusting the gain of said feedback means in dependence upon certain predetermined characteristics of said digital output signal, said digital gain control means comprising:
gate means connected to the output of said digitising means and operable to selectively gate said digital output signal;
detector means connected to the output of said digitising means and operable to detect said predetermined characteristics of the digital output signal and to output a digital signal in accordance therewith;
a state machine or counter connected to the output of said detector means, said state machine comprising latch means for holding a gain value in digital form and means for varying said gain value up or down in accordance with the output signal from said detector means;
a pulse width generator connected to the output of the state machine for generating at its output a digital gain control signal whose pulse width is dependent upon the gain value held in the state machine; and
means for applying said gain control signal to a control terminal of said gate means in order to control the enable time of said gate means and thus vary the gain of the feedback means.

12. Apparatus as claimed in claim 11 wherein said detector means includes a slope overload detector for detecting when the estimated signal deviates from said actual signal, as evidenced in said digital output signal by the occurrence of a predetermined number of successive identical bits.

13. Apparatus as claimed in either one of claims 11 or 12 wherein said detector means includes an idle pattern detector for detecting a low amplitude level in said analogue input signal, and reducing the loop gain to compensate.

14. Apparatus as claimed in either one of claims 11 or 12 wherein said gate means takes the form of a tri-state gate whose enable mode is pulse width modulated by the pulse width generator means.

15. Apparatus as claimed in either one of claims 11 or 12 wherein said feedback means further includes filter means for receiving the gated output of said gate means and converting said into an analogue signal representative of an estimate of said input signal.

16. Apparatus as claimed in claim 15 wherein said filter means takes the form of a capacitor-resistor network.

17. Apparatus as claimed in either one of claims 11 or 12 wherein two of said feedback means are provided from the output of the digitising means to the input of the comparator means: a first feedback means comprising an AC coupled circuit operable to pass the frequencies of the signal being encoded; and a second feedback means comprising a low pass filter circuit operable to pass the necessary dc bias levels, but passing signals without any significant effect thereon in the range of the frequencies of the signal being encoded.

18. Apparatus as claimed in claim 17 wherein said first feedback means includes said digital gain control means, and said second feedback means is isolated from said gain control means.

* * * * *